US011398336B2

(12) United States Patent
Isler et al.

(10) Patent No.: US 11,398,336 B2
(45) Date of Patent: Jul. 26, 2022

(54) ELECTRIC TRANSFORMER ASSEMBLY, METHOD FOR DETERMINING A THERMAL STATE OF AN ELECTRIC TRANSFORMER, AND DETERMINATION DEVICE

(71) Applicant: Hitachi Energy Switzerland AG, Baden (CH)

(72) Inventors: Stephane Isler, Faucigny (FR); Valter Porcellato, Vaud (CH)

(73) Assignee: Hitachi Energy Switzerland AG, Baden (CH)

( * ) Notice: Subject to any disclaimer, the term of this patent is extended or adjusted under 35 U.S.C. 154(b) by 0 days.

(21) Appl. No.: 17/436,363

(22) PCT Filed: Mar. 5, 2020

(86) PCT No.: PCT/EP2020/055883
§ 371 (c)(1),
(2) Date: Sep. 3, 2021

(87) PCT Pub. No.: WO2020/178390
PCT Pub. Date: Sep. 10, 2020

(65) Prior Publication Data
US 2022/0102049 A1   Mar. 31, 2022

(30) Foreign Application Priority Data
Mar. 6, 2019   (EP) .................... 19161037

(51) Int. Cl.
*H01F 27/10*   (2006.01)
*H01F 27/40*   (2006.01)
*G01K 7/42*   (2006.01)

(52) U.S. Cl.
CPC ............. *H01F 27/10* (2013.01); *G01K 7/427* (2013.01); *H01F 27/402* (2013.01); *H01F 2027/406* (2013.01)

(58) Field of Classification Search
CPC ......... H01F 2027/404; H01F 2027/402; H01F 2027/406; H01F 27/10; H01F 27/08;
(Continued)

(56) References Cited

U.S. PATENT DOCUMENTS 9,395,252 B1 *   7/2016   Frounfelker ........... G01K 7/427
2004/0156428 A1   8/2004   Miyashita
(Continued)

FOREIGN PATENT DOCUMENTS

| DE | 10065800 A1 | 7/2002 |
| EP | 1085635 A2 | 3/2001 |
| EP | 1470948 A1 | 10/2004 |

OTHER PUBLICATIONS

International Search Report and Written Opinion of the International Searching Authority, PCT/EP2020/055883, dated Mar. 20, 2020, 16 pages.
(Continued)

*Primary Examiner* — Tuyen T Nguyen
(74) *Attorney, Agent, or Firm* — Sage Patent Group

(57) ABSTRACT

A transformer assembly includes an electric transformer a temperature sensor system, and a computation unit for determining a thermal state of the electric transformer. The electric transformer includes a cooling device having at least one liquid coolant channel to absorb exhaust heat from the electric transformer a heat spreader for transferring heat from the liquid coolant to a heat dissipation surface of the heat spreader, and an air blower configured to effect an airstream along the heat dissipation surface. The temperature sensor system includes an entering coolant sensor for providing an entering coolant temperature signal, a leaving coolant sensor for providing a leaving coolant temperature signal, an entering airstream sensor for providing an entering airstream temperature signal, and a leaving airstream
(Continued)

sensor for providing a leaving airstream temperature signal. The computation unit is configured to determine a thermal state of the transformer.

20 Claims, 3 Drawing Sheets

(58) Field of Classification Search
CPC ........ H01F 27/16; H01F 27/18; H01F 27/125; H01F 27/402; G01K 7/427
See application file for complete search history.

(56) References Cited

U.S. PATENT DOCUMENTS

| | | |
|---|---|---|
| 2004/0158428 A1 | 8/2004 | Byrd et al. |
| 2014/0297206 A1* | 10/2014 | Silverman ............... H02J 3/381 |
| | | 702/58 |
| 2020/0174540 A1* | 6/2020 | Takatori ................... G06F 1/26 |

OTHER PUBLICATIONS

Extended European Search Report dated Apr. 11, 2019 for European Patent No. 19161037.7, 9 pages.

* cited by examiner

ELECTRIC TRANSFORMER ASSEMBLY, METHOD FOR DETERMINING A THERMAL STATE OF AN ELECTRIC TRANSFORMER, AND DETERMINATION DEVICE

CROSS REFERENCE TO RELATED APPLICATIONS

This application is a 35 U.S.C. § 371 national stage application of PCT International Application No. PCT/EP2020/055883 filed on Mar. 5, 2020, which in turns claims foreign priority to European Patent Application No. 19161037.7, filed on Mar. 6, 2019, the disclosures and content of which are incorporated by reference herein in their entirety.

TECHNICAL FIELD

The present disclosure relates to an electric transformer assembly including a means for determining a thermal state of the transformer assembly. It relates further to a corresponding method and a corresponding determination device.

BACKGROUND

When an electric transformer is operated, in particular a traction transformer for a rail vehicle such as a train, a considerable amount of heat has to be dissipated from— among others—the transformer coils and the transformer core. A conventional transformer assembly includes an electric transformer, such as traction transformer, and a cooling unit or cooling device. In a coolant channel, a liquid coolant such as a mineral, ester or silicone fluid (hereinafter, referred to as "oil" for simplicity) is circulated such that heat from the transformer coils is transferred to the coolant. A heat spreader of the cooling unit is in thermal connection with the coolant channel. Heat from the coolant is transferred to the heat spreader. The heat spreader comprises a plurality of air channels, usually defined by fins, to enlarge the surface area that contributes to a dissipation of the heat to the ambient air.

In particular with traction transformers, the power density is high when compared to distribution transformers, due to the fact that they are embedded in a train, with strict weight restrictions. This may result in even higher losses and thus a larger amount of heat that has to be dissipated. The fins that define the air channels have a comparatively small space, or pitch, in between; a typical pitch is in the range of a few millimeters. Foreign elements, such as dust, leaves, pollen, carbon dust from the pantograph, can easily block the air channels.

When the air channels are blocked, the traction transformer is prone to overheating. In such an overtemperature situation, the allowable power might be reduced, resulting in a low-power state in which the train equipped with the traction transformer has to slow down.

Conventionally, the transformer assembly and in particular the air channels of the heat spreader are inspected visually by a human operator or maintenance person. Visual inspection has several drawbacks, such as the men-hours needed for frequent (scheduled) inspections and their inherent inaccuracy.

US 2004/0158248 A1 describes a cooling system for cooling an electrical power transformer. A plurality of sensors monitor, among others, a transformer top oil temperature (a coolant temperature). An intelligent controller is configured to compute a measured heat removal rate from the coolant temperature, and to compute a calculated heat removal rate from a combination of the coolant temperature, an ambient temperature, and others. When a ratio of the removal rates is not within a predetermined range of values, an alarm condition is generated.

For the measured heat removal rate, the conventional technique known from US 2004/0158428 A1 relies on the coolant temperature only, thus having a reduced accuracy. This may lead to generating a false-positive alarm condition.

EP 1 085 635 A2 describes an analysis apparatus and a method for fluid filled electrical equipment including sensors for measuring various parameters of the electrical equipment.

EP 1 470 948 A1 describes a traction transformer including an interface unit having a processor for monitoring the operating status of a traction transformer, based on an operating parameter.

DE 100 65 800 A1 describes a transformer having a core, windings and coolant channels (14) filled with coolant, wherein a number of material elements and coolant elements are associated with the windings and coolant and associating material elements are associated with coolant elements, and the heat loss in the material elements is determined based on the operation of the transformer.

There is a desire for a transformer assembly in which a thermal state thereof can be determined with high accuracy, without the need for error-prone and time-consuming visual inspections.

SUMMARY OF THE INVENTION

According to one aspect, a transformer assembly is provided that comprises an electric transformer, a temperature system, and a computation unit.

The electric transformer includes a cooling device. The cooling device has at least one liquid coolant channel, a heat spreader in thermal communication with the liquid coolant channel, and an air blower.

The liquid coolant channel is arranged in a way that exhaust heat from the electric transformer is absorbed by means of a liquid coolant that is passed through the liquid coolant channel.

The heat spreader is arranged and configured for transferring heat from the liquid coolant to a heat dissipation surface of the heat spreader.

The air blower is arranged and configured to effect an airstream along the heat dissipation surface of the heat spreader.

The temperature system includes an entering coolant sensor, a leaving coolant sensor, an entering airstream sensor and a leaving airstream sensor.

The entering coolant sensor is arranged to measure an entering coolant temperature of the liquid coolant upstream of the electric transformer. The entering coolant sensor is configured to provide, or output, an entering coolant temperature signal.

The leaving coolant sensor is arranged to measure a leaving coolant temperature of the liquid coolant downstream of the electric transformer. The leaving coolant sensor is configured to provide, or output, a leaving coolant temperature signal.

The entering airstream sensor is arranged to measure an entering airstream temperature of the airstream upstream of the heat spreader. The entering airstream sensor is configured to provide, or output, an entering airstream temperature signal.

The leaving airstream sensor is arranged to measure an entering airstream temperature of the airstream downstream of the heat spreader. The leaving airstream sensor is configured to provide, or output, a leaving airstream temperature signal.

The computation unit is configured to receive the sensor signals from the temperature system. The computation unit is further configured to determine a thermal state of the transformer by relating the sensor signals to each other.

According to a further aspect, a method for determining a thermal state of an electric transformer is provided. The electric transformer includes a cooling device. The cooling device has at least one liquid coolant channel, a heat spreader in thermal communication with the liquid coolant channel, and an air blower.

The liquid coolant channel is arranged in a way that exhaust heat from the electric transformer is absorbed by means of a liquid coolant that is passed through the liquid coolant channel.

The heat spreader is arranged and configured for transferring heat from the liquid coolant to a heat dissipation surface of the heat spreader.

The air blower is arranged and configured to effect an airstream along the heat dissipation surface of the heat spreader.

The method comprises obtaining an entering coolant temperature, obtaining a leaving coolant temperature, obtaining an entering airstream temperature, and obtaining a leaving airstream temperature, and determining a thermal state of the transformer assembly by relating the obtained temperatures to each other.

According to yet a further aspect, a determination device for determining a thermal state of an electric transformer of an electric transformer assembly is provided.

The electric transformer includes a cooling device. The cooling device has at least one liquid coolant channel. The electric transformer further includes a heat spreader in thermal communication with the liquid coolant channel, and an air blower. The electric transformer assembly further includes a temperature sensor system.

The liquid coolant channel is arranged in a way that exhaust heat from the electric transformer is absorbed by means of a liquid coolant that is passed through the liquid coolant channel.

The heat spreader is in thermal communication with the coolant channel.

The air blower is arranged and configured to effect an airstream along a heat dissipation surface of the heat spreader.

The temperature system includes an entering coolant sensor, a leaving coolant sensor, an entering airstream sensor and a leaving airstream sensor.

The entering coolant sensor is arranged to measure an entering coolant temperature of the liquid coolant upstream of the electric transformer. The entering coolant sensor is configured to provide, or output, an entering coolant temperature signal.

The leaving coolant sensor is arranged to measure a leaving coolant temperature of the liquid coolant downstream of the electric transformer. The leaving coolant sensor is configured to provide, or output, a leaving coolant temperature signal.

The entering airstream sensor is arranged to measure an entering airstream temperature of the airstream upstream of the heat spreader. The entering airstream sensor is configured to provide, or output, an entering airstream temperature signal.

The leaving airstream sensor is arranged to measure an entering airstream temperature of the airstream downstream of the heat spreader. The leaving airstream sensor is configured to provide, or output, a leaving airstream temperature signal.

The determination device is configured to determine the thermal state by carrying out a method as disclosed herein. In some embodiments, the determination device includes or is a computation unit as described in some embodiments of this disclosure.

In the technology disclosed herein, it is not only the temperature of the coolant upstream of the electric transformer and the temperature of the coolant downstream of the electric transformer, but also the temperature of the airstream upstream of the heat spreader and the temperature downstream of the heat spreader that are used in the determination of the thermal state, leading to an improved accuracy of the thermal state determination over the prior-art solutions. From the determined thermal state, a condition that affects the cooling performance, such as any clogging amount of heat spreader air channels or the like, can be detected with high accuracy, without the need of error-prone and time-consuming visual inspections.

BRIEF DESCRIPTION OF THE DRAWINGS

Embodiments of the present disclosure will be described with reference to the accompanying drawings in which.

DESCRIPTION OF EXEMPLARY EMBODIMENTS

In the following, exemplary embodiments are described in more detail. The skilled person will understand that aspects and features of the embodiments may be combined as appropriate, and that aspects and features may be omitted as appropriate.

Regarding some of the features of embodiments described herein, one or more of the following holds, as applicable in the respective context: A method, as described herein, includes these features of the respective embodiment; a computation unit in a transformer assembly, as described herein, is configured to perform these features of the respective embodiment; a determination device, as described herein, is configured to perform these features of the respective embodiment. For the sake of readability, the respective features are described in the context of a transformer assembly having the computation unit; however, it is understood that the features are equally well applicable in the method context and/or in the context of the determination device.

Figure 1:
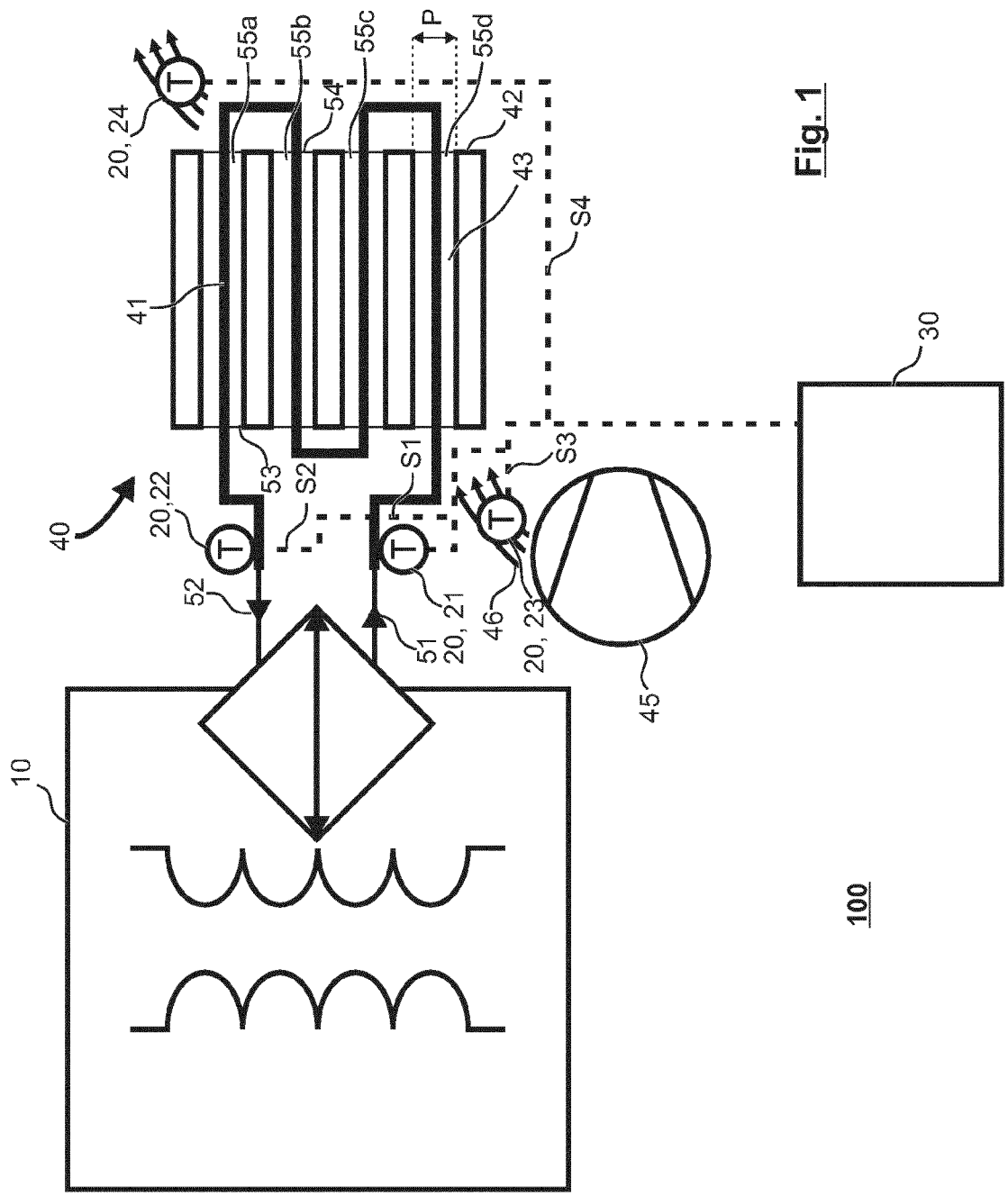
FIG. 1 is a schematic diagram of a transformer assembly according to embodiments of the present disclosure.

FIG. 1 illustrates a schematic diagram of a transformer assembly 100 according to embodiments of the present disclosure. The transformer assembly 100 includes an electric transformer 10, in particular a traction transformer for a rail vehicle. The transformer 10 is shown only schematically; in particular, any electrical interconnections are omitted from the drawing for simplicity.

In operation, losses in the electric transformer 10 (e. g., iron and copper loss) contribute to heat development inside the transformer 10 and on its surfaces. The electric transformer 10 includes a cooling device 40 for heat dissipation. The cooling device 40 is configured to circulate a liquid coolant, such as a mineral, ester or silicone fluid, through at least one liquid coolant channel 41. The coolant channel 41 is arranged such that it can absorb exhaust heat from the electric transformer 10, for example by conducting the coolant channel 41 through the interior of the transformer 10 and/or on a surface of surfaces thereof.

A heat spreader 42 of the cooling device 40 is in thermal communication with the coolant channel 41. Heat from the liquid coolant, in particular absorbed heat from the transformer 10, is transferred to a heat dissipation surface 43 of the heat spreader 42. At least the heat dissipation surface 43 of the heat spreader 42 is typically formed of a material having a good thermal conductivity, such as a metal material. An air blower 45 of the cooling device 40 is arranged such that it effects, or blows, an airstream 46 along the heat dissipation surface 43 of the heat spreader 42.

The transformer assembly 100 further comprises a temperature sensor system 20. The temperature sensor system includes at least the following temperature sensors: An entering coolant sensor 21, a leaving coolant sensor 22, an entering airstream sensor 23 and a leaving airstream sensor 24.

The entering coolant sensor 21 is arranged such that it measures the temperature of the liquid coolant before or when it enters an area of the cooling device 40. In other words: The entering coolant sensor 21 is arranged to measure the coolant temperature upstream of the cooling unit 40. The signal from the entering coolant sensor 21 is provided, or output, as an entering coolant temperature signal S1.

The leaving coolant sensor 22 is arranged such that it measures the temperature of the liquid coolant after it has passed the area of the cooling device 40, and has been lowered in temperature. In other words: The leaving coolant sensor 22 is arranged to measure the coolant temperature downstream of the cooling device 40. The signal from the leaving coolant sensor 22 is provided, or output, as a leaving coolant temperature signal S2.

The entering airstream sensor 23 is arranged such that it measures the temperature of the airstream 46 before or when it enters an area of the heat spreader 42 in which heat from the coolant is transferred to the heat spreader 42, particularly the heat spreader surface 43. In other words: The entering airstream sensor 23 is arranged to measure the airstream temperature upstream of the heat spreader 42. The signal from the entering airstream sensor 23 is provided, or output, as an entering airstream temperature signal S3.

The leaving airstream sensor 24 is arranged such that it measures the temperature of the airstream 46 when or after it has passed the area of the heat spreader 42 in which heat from the coolant is transferred to the heat spreader 42, particularly the heat spreader surface 43. In other words: The leaving airstream sensor 24 is arranged to measure the airstream temperature downstream of the heat spreader 42. The signal from the leaving airstream sensor 24 is provided, or output, as a leaving airstream temperature signal S4.

In embodiments, one or more of the following features holds: The entering coolant sensor 21 is arranged substantially at a coolant inlet 51 for the liquid coolant into the cooling device 40. The leaving coolant sensor 22 is arranged substantially at a coolant outlet 52 for the liquid coolant out of the cooling device 40. The entering airstream sensor 23 is arranged substantially at an air inlet-side edge 53 of the heat spreader 42. The leaving airstream sensor 24 is arranged substantially at an air outlet-side 54 edge of the heat spreader 42.

A computation unit 30 receives the sensor signals S1, S2, S3, S4 from the temperature system 20. The computation unit 30 typically receives the sensor signals S1, S2, S3, S4 via wire communication. For example, one or more of the sensors 21, 22, 23, 24 providing the sensor signals S1, S2, S3, S4 are passive sensors, such as, but not limited to, temperature-sensitive resistive elements, e. g. Pt100 resistors. In the exemplary case of passive sensors, the sensor signals S1, S2, S3, S4 are resistance values, and the configuration may be such that the computation unit 30 performs the corresponding resistance measurements. However, it is also conceivable that one or more of the sensors 21, 22, 23, 24 are active sensors. In this context, the configuration may be such that one or more of the sensor signals S1, S2, S3, S4 are communicated e. g. via a data bus, but it is also conceivable that the computation unit 30 receives the sensor signals S1, S2, S3, S4 via wireless communication. The computation unit 30 determines a thermal state of the transformer 10. In particular, the computation unit 30 determines the thermal state of the cooling device 40 or of parts of the cooling device 40. In order to determine the thermal state, the computation unit 30 relates the sensor signals S1, S2. S3, S4 to one another.

A thermal state, as used herein, is typically a condition that is related to thermal aspects of the transformer. In embodiments, the thermal state of the transformer 10 is reflected by a thermal state of the cooling device 40 or one or more parts thereof. In particular, in embodiments, the thermal state of the transformer 10 may be assumed to resemble the thermal state of the cooling device 40 or the respective part(s). For example, the thermal state of the cooling device 40 resembles a heat dissipation performance of the heat spreader 42.

In general, the thermal state reflects the thermal power $P_{th}$ withdrawn from the coolant by the heat spreader 42. $P_{th}$ can be calculated based on the following formula:

$$P = Q_{m,coolant} C_{p,coolant} \Delta T_{coolant}$$

where $Q_{m,coolant}$ is the flow rate of the coolant (typically in kg/s), $C_{p,coolant}$ is the specific thermal capacity of the coolant (typically in J/(kg·K)), and $\Delta T_{coolant}$ ($=T_{coolant,in} - T_{coolant,out}$) is the difference between the coolant temperature at the cooling device entrance and its outlet.

A thermal resistance $R_{th,cooling}$ (typically in K/W) is typically known, e. g. provided by a supplier of the cooling device. Based on $R_{th,cooling}$, the thermal power is given by:

$$P = \frac{1}{R_{th,cooling}} (T_{coolant,av} - T_{air,av})$$

Herein, $T_{coolant,av}$ designates the average coolant temperature, $T_{air,av}$ designates the average air temperature, and $\Delta T_{coolant}$ designates the coolant difference temperature. Thus:

$$RCQ = R_{th,cooling} C_{p,coolant} Q_{m,coolant} = \frac{T_{coolant,av} - T_{air,av}}{\Delta T_{coolant}}.$$

RCQ, reflecting the thermal state, is not a constant value. Furthermore, the flow rate $Q_{m,coolant}$ of the coolant cannot be easily measured. In embodiments, a set of reference values, or a reference characteristic $RCQ_{ref}$ of RCQ depending on a coolant temperature $T_{coolant}$ is deducted from a reference measurement. The reference measurement can, for example, be carried out with the transformer assembly 100 disclosed herein. In further embodiments, the reference characteristic $RCQ_{ref}$ of RCQ can be determined via a numerical simulation of the system, e. g. a computer simulation of the transformer assembly 100. In each case, the reference characteristic $RCQ_{ref}$ resembles a state in which the heat dissipation ability of the cooling device 40 is not substantially lowered or de-rated e. g through clogging of air channels in the heat spreader 42; in other words, the reference characteristic $RCQ_{ref}$ resembles an essentially non-clogged state. Regardless of whether $RCQ_{ref}$ is obtained through reference measurements or numerical simulation, the process of obtaining $RCQ_{ref}$ may also be referred to as "calibration" hereinafter.

In embodiments, the computation unit 30 is configured to compute an average air temperature $T_{air,av}$ from the entering airstream temperature signal S3 and the leaving airstream temperature signal S4, compute an average coolant temperature $T_{coolant,av}$ from the entering coolant temperature signal S1 and the leaving coolant temperature signal S2, compute a coolant difference temperature $\Delta T_{coolant}$ from the entering coolant temperature signal S1 and the leaving coolant temperature signal S2, and determine the thermal state of the transformer by relating the average air temperature $T_{air,av}$ the average coolant temperature $T_{coolant,av}$ and the coolant difference temperature $\Delta T_{coolant}$ to each other.

In embodiments, the computation unit 30 is configured to determine the thermal state RCQ of the transformer via the formula:

$$RCQ = \frac{T_{coolant,av} - T_{air,av}}{\Delta T_{coolant}}.$$

Herein, $T_{coolant,av}$ designates the average coolant temperature, $T_{air,av}$ designates the average air temperature, and $\Delta T_{coolant}$ designates the coolant difference temperature.

In the embodiments described herein, it is conceivable that the computation unit 30 is adapted to determine the thermal state repeatedly, such as in predetermined time intervals. In this regard, the computation unit 30 may further be configured to store a time series of thermal states in a memory, for example a volatile or a non-volatile memory such as a RAM, a flash memory, a hard disc drive etc. For example, the thermal state may be determined in intervals such as every ten seconds, every minute, every ten minutes or the like, and stored in the memory as time-series data. It is conceivable to store the time series of the thermal state in a circular buffer of an appropriate size.

In embodiments, the computation unit 30 is further configured to determine a thermal rating compliance of the transformer by referring the thermal state RCQ to a reference state. According to a first example of obtaining the reference state, the reference state is obtained by reference measurement. According to a second example of obtaining the reference state, the reference state is obtained by a simulation, in particular a simulation making use of a physical model of at least parts of the transformer assembly.

In embodiments, the computation unit 30 is further configured to determine a thermal rating compliance c of the transformer. The thermal rating compliance c is obtained via the formula:

$$c = \frac{RCQ}{RCQ_{ref}(T_{coolant})} - 1.$$

Herein, $RCQ_{ref}$ designates the reference state as a function of the coolant temperature $T_{coolant}$, as described above.

The value of the thermal rating compliance c equals 0 when the cooling device works with the same performance as during the calibration. When the value differs from 0, or when the value differs from a predetermined tolerance range around 0, a performance de-rating has occurred. In practice, it is a value above 0, or above a corresponding tolerance limit above 0, in which a de-rating is determined. Thermal de-rating, as used herein, typically refers to a condition in which the current allowable output power of the transformer is lower than a rated power of the transformer due to an overtemperature condition, i. e. a transformer overheating.

In some embodiments, a tolerance limit above 0 may reflect a range in which the clogging state of the air channels in the heat spreader 42 is not strictly 0%, but nevertheless the current allowable output power of the transformer has not fallen below the rated power of the transformer. In other words: The tolerance limit may be predetermined such that a nominal power rating of the transformer can still be guaranteed until a clogging value that reflects the tolerance limit (for example, but not limited to, a clogging value of 20%, expressed as c=0.2; a clogging value of 25%, expressed as c=0.25; or a clogging value of 30%, expressed as c=0.3) and in worst case conditions (such as, for example, an ambient temperature of 45° C. and maximum solar irradiation).

In some embodiments, the computation unit 30 is configured to determine that a thermal de-rating has occurred when the thermal rating compliance c of the transformer exceeds a predetermined thermal rating compliance threshold. In an example, the thermal rating compliance threshold is predetermined to be in the range between 0.1 and 0.4, more particularly a threshold in the range between 0.1 and 0.3. For example, for a traction transformer, a threshold around 0.2 can be considered as a limit, since on some traction transformers, a margin of around 20% is taken on the thermal design to take into account any de-rating, e. g. due to clogging.

In embodiments, the thermal rating compliance threshold is predetermined based on one or more expected environmental conditions and/or based on one or more forecast environmental conditions. An environmental condition, as used herein, is a condition related to circumstances present in the surroundings of the transformer or the transformer assembly such as an ambient temperature, an ambient humidity (e. g., a relative humidity of the ambient air), a radiation (e. g., a solar radiation) acting on the transformer or the transformer assembly, etc.

An expected environmental condition may be determined based on an interpolation or an extrapolation of related measurement data. As one example, an expected ambient temperature may be determined by interpolating or extrapolating past samples of measurement values of the ambient temperature.

The related measurement data may be sampled and stored in a memory, for example a volatile or a non-volatile memory such as a RAM, a flash memory, a hard disc drive etc. For example, the measurement data may be sampled in appropriate intervals, such as every ten seconds, every minute, every ten minutes or the like, and stored in the memory as time-series data. It is conceivable to store the measurement data in a circular buffer of an appropriate size. Also, it is conceivable to use a limited amount of past data for determining the respective expected environmental condition, such as all the data or parts of the data each relating to the past one hour, past two hours, past five hours etc.

A forecast environmental condition may be determined based on a weather forecast that is valid for a location or site at which the transformer assembly or transformer is located. For example, the forecast environmental condition may be obtained from a weather forecast service via a data network, such as the internet. As one example, a forecast ambient temperature may be obtained from the weather forecast service via the data network. As a second example, a forecast mean value of solar radiation is obtained from the weather forecast service via the data network. The forecast environmental conditions may be determined for a future point in time; likewise, the forecast environmental conditions may be determined for a future time interval as time-series data or as mean data, such as arithmetic mean values of data.

Particularly in the case of a traction transformer mounted on a train vehicle, the location or site may change with time. It is conceivable that in determining the forecast environmental condition, a future location or site (i. e., an expected location or site) is first determined; and then, the forecast environmental condition is determined (e. g., obtained from the weather forecast service via the data network) for the future location or site. Likewise, it is conceivable that in determining the forecast environmental condition, a series of future locations or sites is first determined; and then, a respective forecast environmental condition is determined (e. g., obtained from the weather forecast service via the data network) for some or each future location or site in the series. In this context, it is also conceivable to determine a mean value of the plurality of forecast environmental conditions of some or each future locations or sites in the series. Likewise, it is conceivable to determine a worst-case value of the plurality of forecast environmental conditions of each future location or site in the series. Typically, the series reflects a schedule of locations or sites that the train vehicle is planned to go.

In embodiments, the computation unit 30 is configured to evaluate whether the entering coolant temperature signal, the leaving coolant temperature signal, the entering airstream temperature signal, and the leaving airstream temperature signal satisfy a consistency relation with each other. According to the embodiment, the computation unit is further configured to determine a thermal fault of the transformer if the consistency relation is not satisfied. The consistency relation is typically predetermined, e. g. via a reference measurement. In embodiments, the consistency relation is based on a physical model of the transformer 10, e. g. via a numerical simulation taking into account the physical model.

In embodiments, the consistency relation includes a lower threshold condition for the leaving airstream temperature signal as a function of the entering coolant temperature signal, the leaving coolant temperature signal, the entering airstream temperature signal. The computation unit 30 is configured to determine the thermal fault as a heat spreader insufficiency if the lower threshold condition for the leaving airstream temperature signal is not satisfied.

A lower threshold condition, as used herein, is typically defined such that the leaving airstream temperature should be lower than the threshold in order to determine that there is no heat spreader insufficiency.

A heat spreader insufficiency, or insufficient heat dissipation capability of the heat spreader 42, may be a result of foreign objects on the heat dissipation surface 43, such as dust, pollen, carbon dust from the pantograph, and others. In the case of a major heat spreader insufficiency, the transformer 10 may easily enter an overtemperature state, which may lead to a de-rating operation or a forced de-energization of the transformer. The threshold may be determined such that a heat spreader insufficiency is detected or determined at an early state (i. e., a minor heat spreader insufficiency). When such a minor heat spreader insufficiency is determined, appropriate measures may be taken, such as scheduling and/or performing an inspection at the next appropriate point in time, scheduling and/or performing a cleaning operation at the next appropriate point in time, etc.

Typically, the computation unit 30 is configured to determine and store a time series of the thermal rating compliance c. For example, but not by limitation, the thermal rating compliance c is determined and stored each second, each five seconds, each ten seconds, or at different rates.

In embodiments, the computation unit 30 is further configured to determine a time series of the thermal rating compliance c, to obtain an expected future thermal rating compliance by way of interpolation and/or extrapolation of the time series, and to determine, from the expected future thermal rating compliance, a point of time at which the thermal rating compliance threshold is to be exceeded.

In this context, a maintenance operation, such as an inspection or a cleaning operation, is typically scheduled to be performed before the determined point of time at which the thermal rating compliance threshold is to be exceeded.

In embodiments, the computation unit 30 is further configured to compensate one or more of the sensor signals S1, S2, S3, S4 from the temperature sensor system 20 for fluctuation. Measurement signals, such as the signals from the temperature sensor system 20, show a fluctuation due to inherent limited accuracy, such as quantization noise, fluctuations of the time base and so on. A fluctuation compensation may be applied directly to one or more of the signals from the temperature sensor system. It is also possible to apply a fluctuation compensation to a signal or series of values that is derived from the measurement signals. In an example, a fluctuation compensation is applied to the thermal rating compliance c.

In particular, the computation unit 30 is configured to compensate a time series of the thermal rating compliance c for fluctuation by means of a numerical filter function, such as an infinite impulse response numerical filter (IIR filter). Of the numerical filters, an IIR filter typically requires fewer coefficients and less memory space. The nonlinear phase response of an IIR filter does not have a negative impact on the non-sinusoidal signals related to the sensor signals from the temperature sensor system, such as the thermal rating compliance. In an example, an IIR numerical filter having a time constant of several tens of minutes, such as more than 20 minutes, more than 30 minutes or more than 40 minutes, is applied to the time series of the thermal rating compliance c.

In embodiments, the heat spreader 42 has multiple air ducts 55a, 55b. 55c, 55d. The air ducts 55a, 55b, 55c, 55d are arranged at a substantially equal pitch P on the heat dissipation surface 43. The air ducts 55a, 55b, 55c, 55d are arranged in such a manner that each air duct sandwiches at least a portion of the at least one cooling channel 41. For example, the air ducts 55a, 55b, 55c, 55d are each formed between mutually adjacent fins (not shown) protruding from the heat dissipation surface 43, and each pair of mutually adjacent fins sandwiches the respective coolant channel 41.

In an example, the pitch is a pitch of less than 10 mm, particularly a pitch of less than 5 mm or of less than 3 mm. Air channels having a pitch in the sub-centimeter range are prone to clogging by foreign objects such as small particles, pollen, carbon dust etc. Taking into account the environmental conditions such as ambient temperature, solar irradiation and so on, a light clogging, e. g. a clogging of less than 10% or less than 20% of the surface are, may be admissible to continue the operation of the transformer, particularly the traction transformer. Conventionally, a clogging state of air channels had to be inspected visually. With the present technology, it is possible to detect any such dogging from the thermal state. In particular, it can be assumed that the thermal rating compliance c of the transformer, as described herein, is representative of the clogging state.

Figure 2A:
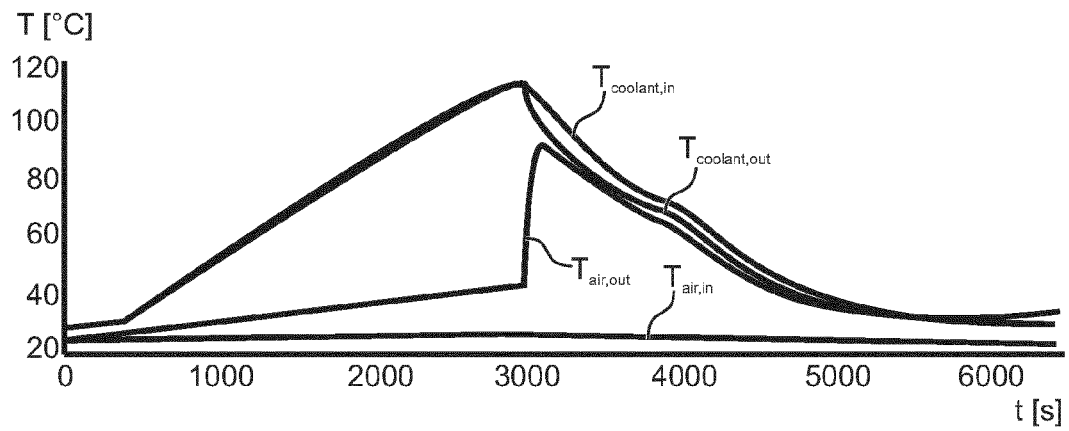
FIGS. 2*a-e* are graphs of exemplary measurement and calculation results used in embodiments of the present disclosure.
Figure 2B:
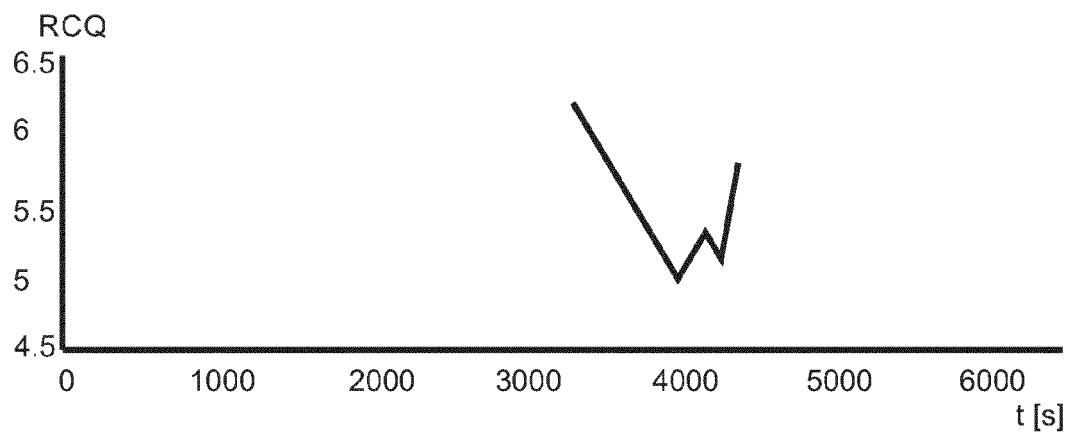
Figure 2C:
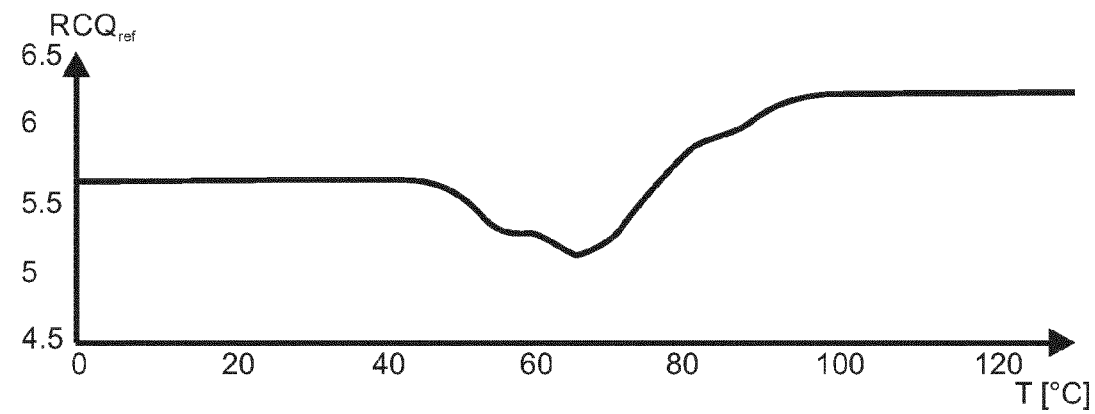

In FIGS. 2a through 2c, graphs of exemplary measurement and calculation results used for determining a reference characteristic curve $RCQ_{ref}$ via an experiment are shown. Specifically, FIG. 2a shows a combined graph of temperature measurements based on the signals from the temperature sensor system over time, FIG. 2b shows a characteristic curve of RCQ, reflecting the thermal state, obtained from the temperature measurements of FIG. 2a via the formula described above, and FIG. 2c shows a reference characteristic curve $RCQ_{ref}$ obtained from a combination of the graphs of FIGS. 2a and 2b, as a function of the coolant temperature $T_{coolant}$, wherein $T_{coolant}$ is the function argument.

In FIG. 2a, the entering airstream temperature $T_{air,\ in}$ in varies the least over time. The entering coolant temperature $T_{coolant,in}$ and the leaving coolant temperature $T_{coolant,out}$ begin to rise until approximately 3000 seconds have passed, from about 20-30° C. to approximately 110° C. After approximately 3000 seconds have passed, the air blower 45 is started, and the leaving airstream temperature $T_{air,out}$ starts rising, where at about the same time, both the entering coolant temperature $T_{coolant,\ in}$ and the leaving coolant temperature $T_{coolant,out}$ begin to fall again.

From the temperature curves of FIG. 2a, that may also be referred to as learning or calibration curves, a representative time slot—in the present example, between approximately 3000 seconds and 4500 seconds—is used to calculate a representative characteristic of RCQ, as shown in FIG. 2b. Herein, the values of FIG. 2a are used in the above-described formula of $$RCQ = \frac{T_{coolant,av} - T_{air,av}}{\Delta T_{coolant}}.$$

to obtain RCQ.

From RCQ over time in FIG. 2b, linking the results to the coolant temperature $T_{coolant}$ as the function argument, the reference characteristic curve $RCQ_{ref}$ as a function of $T_{coolant}$, shown in FIG. 2c, is obtained. $RCQ_{ref}$ is, for example, used by the computation unit 30 to determine the thermal rating compliance c via the above-described formula:

$$c = \frac{RCQ}{RCQ_{ref}(T_{coolant})} - 1.$$

Figure 2D:
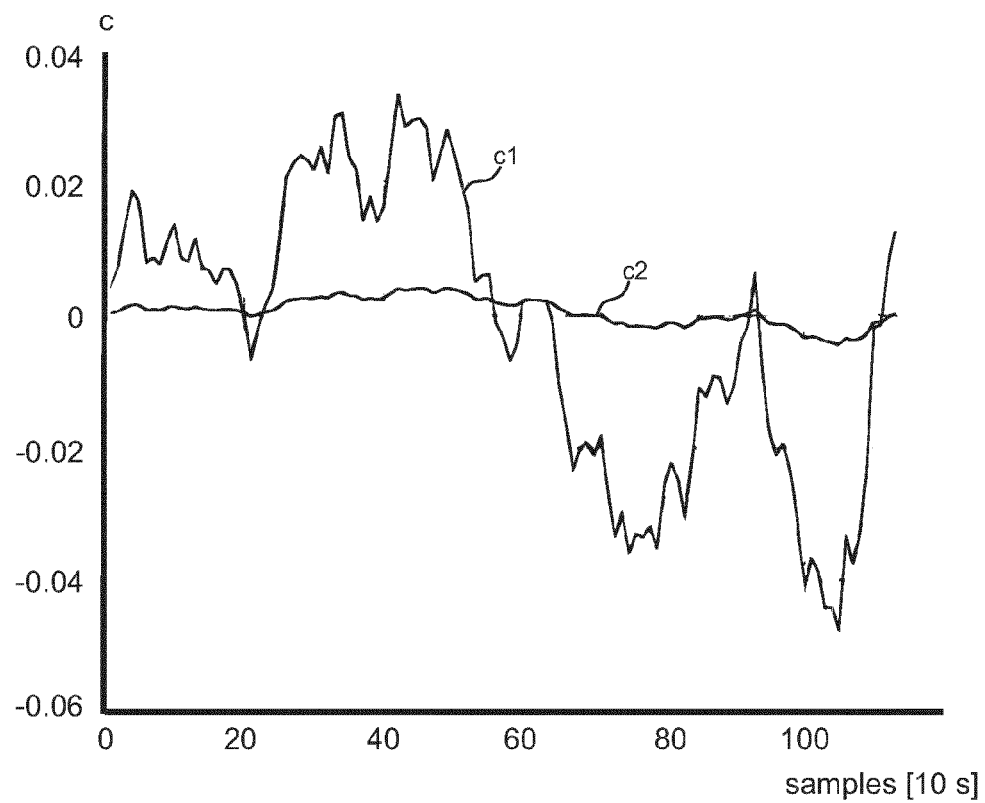
Figure 2E:
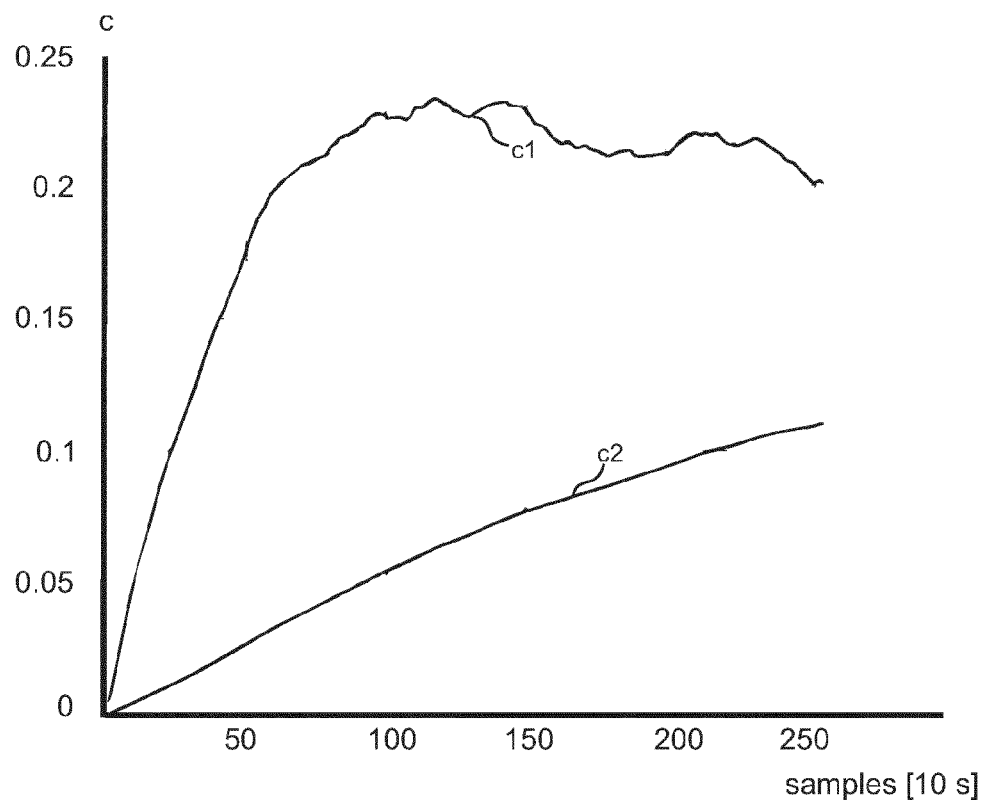

FIGS. 2d and 2e each show a time series of the thermal rating compliance c, compensated for fluctuation by means of an IIR numerical filter. In both FIGS. 2d and 2e, the reference characteristic curve $RCQ_{ref}$ as a function of $T_{coolant}$ of FIG. 2c, that was calibrated at 0% clogging, was used to obtain the values of c, wherein $T_{coolant}$ serves as the function argument. FIG. 2d shows the results for a clogging state of about 0%, whereas FIG. 2e shows the results for a clogging state of about 20%. In each of FIGS. 2d and 2e, c1 and c2 show the value of c as a function of the sample number, wherein the sampling rate was one sample per ten seconds. c1 was obtained using a relatively short time constant of the IIR numerical filter, whereas c2 was obtained using a longer time constant in the range of several tens of minutes.

The present disclosure has been mainly described with reference to embodiments; however, a person skilled in the art will readily appreciate that other embodiments than the ones described above are part of the present disclosure, wherein the scope is defined by the appended claims.

The invention claimed is:

1. A transformer assembly, comprising:
an electric transformer;
a temperature sensor system; and
a computation unit for determining a thermal state of the electric transformer,
the electric transformer including a cooling device having:
at least one liquid coolant channel arranged such as to absorb exhaust heat from the electric transformer by means of a liquid coolant that is passed through the liquid coolant channel;
a heat spreader al communication with the liquid coolant channel for transferring heat from the liquid coolant to a heat dissipation surface of the heat spreader;
an air blower arranged and configured to effect an airstream along the heat dissipation surface of the heat spreader;
the temperature sensor system including:
an entering coolant sensor arranged for measuring an entering coolant temperature of the liquid coolant upstream of the cooling device and for providing an entering coolant temperature signal;
a leaving coolant sensor arranged for measuring a leaving coolant temperature of the liquid coolant downstream of the cooling device and for providing a leaving coolant temperature signal;
an entering airstream sensor arranged for measuring an entering airstream temperature of the airstream upstream of the heat spreader and providing an entering airstream temperature signal; and
a leaving airstream sensor arranged for measuring a leaving airstream temperature of the airstream downstream of the heat spreader and providing a leaving airstream temperature signal, and
the computation unit being configured to receive the sensor signals from the temperature sensor system, and configured to determine a thermal state of the transformer by relating the sensor signals to each other.

2. The transformer assembly of claim 1, wherein the computation unit is configured to:
compute an average air temperature from the entering airstream temperature signal and the leaving airstream temperature signal;
compute an average coolant temperature from the entering coolant temperature signal and the leaving coolant temperature signal;
compute a coolant difference temperature from the entering coolant temperature signal and the leaving coolant temperature signal; and
determine the thermal state of the transformer by relating the average air temperature, the average coolant temperature and the coolant difference temperature to each other.

3. The transformer assembly of claim 2, wherein the computation unit is configured to determine the thermal state RCQ of the transformer via the following formula:

$$RCQ = \frac{T_{coolant,av} - T_{air,av}}{\Delta T_{coolant}}$$

wherein $T_{coolant,av}$ designates the average coolant temperature, $T_{air,av}$ designates the average air temperature, and $\Delta T_{coolant}$ designates the coolant difference temperature.

4. The transformer assembly of claim 3, wherein the computation unit is further configured to determine a thermal rating compliance of the transformer by referring the thermal state RCQ to a reference state.

5. The transformer assembly of claim 4, wherein the computation unit is configured to determine the thermal rating compliance of the transformer via the following formula:

$$c = \frac{RCQ}{RCQ_{ref}(T_{coolant})} - 1$$

wherein $RCQ_{ref}$ designates the reference state as a function of the coolant temperature $T_{coolant}$, and $T_{coolant}$ serves as the function argument.

6. The transformer assembly of claim 5, wherein the computation unit is configured to determine that a thermal de-rating has occurred when the thermal rating compliance of the transformer exceeds a predetermined thermal rating compliance threshold.

7. The transformer assembly of claim 5, wherein the computation unit is further configured to:
determine a time series of the thermal rating compliance;
obtain an expected future thermal rating compliance by way of interpolation and/or extrapolation of the time series;
determine, from the expected future thermal rating compliance, a point of time at which the thermal rating compliance threshold is to be exceeded; and
schedule a maintenance operation before the determined point of time at which the thermal rating compliance threshold is to be exceeded.

8. The transformer assembly of claim 6, wherein the thermal rating compliance threshold is predetermined based on one or more expected or forecast environmental conditions, the expected or forecast environmental conditions including one or more of a temperature, a solar irradiation, a humidity.

9. The transformer assembly of claim 1, wherein the computation unit is configured to evaluate whether the entering coolant temperature signal, the leaving coolant temperature signal, the entering airstream temperature signal, and the leaving airstream temperature signal satisfy a consistency relation with each other, and to determine a thermal fault of the transformer if the consistency relation is not satisfied.

10. The transformer assembly of claim 9, wherein the consistency relation is based on a physical model of the transformer.

11. The transformer assembly of claim 9, wherein the consistency relation includes a lower threshold condition for the leaving airstream temperature signal as a function of the entering coolant temperature signal, the leaving coolant temperature signal, the entering airstream temperature signal, and wherein the computation unit is configured to determine the thermal fault as a heat spreader insufficiency if the lower threshold condition for the leaving airstream temperature signal is not satisfied.

12. The transformer assembly of claim 1,
wherein the entering coolant sensor is arranged substantially at a coolant or the liquid coolant into the cooling device; and/or
wherein the leaving coolant sensor is arranged substantially at a coolant outlet for the liquid coolant out of the cooling device; and/or
wherein the entering airstream sensor is arranged substantially at an air inlet-side edge of the heat spreader; and/or
wherein the leaving airstream sensor is arranged substantially at an air outlet-side edge of the heat spreader.

13. The transformer assembly of claim 1, wherein the computation unit is further configured to compensate a time series of the thermal rating compliance for fluctuation.

14. The transformer assembly of claim 1, wherein the heat spreader has multiple air ducts arranged at a substantially equal pitch on the heat dissipation surface, wherein the air ducts are arranged such that each sandwiches at least a portion of the at least one coolant channel.

15. The transformer assembly of claim 1, wherein the electric transformer rail vehicle traction transformer.

16. The transformer assembly of claim 1, wherein the computation unit is further configured to determine a thermal state of a component of the cooling device by relating the sensor signals to each other.

17. The transformer assembly of claim 4, wherein the reference state is obtained by reference measurement or a reference state obtained by simulation.

18. The transformer assembly of claim 6, wherein the predetermined thermal rating compliance threshold is in a range between 0.1 and 0.4.

19. The transformer assembly of claim 13, the computation unit is further configured to use a numerical filter function to compensate the time series of the thermal rating compliance for fluctuation.

20. The transformer assembly of claim 14, wherein the pitch is less than 10 mm.

* * * * *